United States Patent [19]

Langrish

[11] Patent Number: 5,510,705
[45] Date of Patent: Apr. 23, 1996

[54] ELECTRICAL TEST ARRANGEMENT AND APPARATUS

[75] Inventor: Michael D. Langrish, Coventry, England

[73] Assignee: GPT Limited, United Kingdom

[21] Appl. No.: 495,870

[22] Filed: Jun. 28, 1995

Related U.S. Application Data

[63] Continuation of Ser. No. 119,287, Sep. 9, 1993, abandoned.

[30] Foreign Application Priority Data

Sep. 28, 1992 [GB] United Kingdom ............... 9220415
Feb. 17, 1993 [GB] United Kingdom ............... 9303139

[51] Int. Cl.⁶ .................................................. G01R 33/00
[52] U.S. Cl. ................................ 324/158.1; 324/760
[58] Field of Search .................... 324/158.1, 760; 73/865.6

[56] References Cited

U.S. PATENT DOCUMENTS

| | | | |
|---|---|---|---|
| 3,664,181 | 5/1972 | Conrad et al. | 73/865.6 |
| 4,528,504 | 7/1985 | Thornton et al. | 324/760 |
| 4,692,694 | 9/1987 | Yokoi et al. | 324/760 |
| 4,812,750 | 3/1989 | Keel et al. | 324/760 |

OTHER PUBLICATIONS

Telcom Report, vol. 14, No. 4, Aug., 1991, Munchen de, pp. 214–217, Born, et al., "EWSD Auf Dem Prufstand", p. 216, left column, paragraph 2—middle column, paragraph 2; figures 1, 2.

Test and Measurement World. (Inc. Electronics Test), vol. 11, May, 1991, Denver, U.S., pp. 9–10, Richman "New Standards Specify Data Line Tests", p. 9, middle column, paragraph 4—right column, paragraph 2, figure 1.

AT&T Technical Journal, vol. 69, No. 3, Jun., 1990, New York, US, pp. 77–96, Welsher, et al., "Design for Electrostatic–Discharge (ESD) Protection . . . ", Figure 9.

Wescon Technical Papers, 2 Nov. 1984, North Hollywood, US, pp. 1–13, Dash, "EMI: The FCC Closes in on Computer Manufacturers", p. 12, left column, paragraph 2—right column, paragraph 2; figure 8.

Primary Examiner—Kenneth A. Wieder
Assistant Examiner—Kourosh Cyrus Khosravi
Attorney, Agent, or Firm—Kirschstein, et al.

[57] ABSTRACT

Apparatus is disclosed for use in the testing of the electromagnetic compatibility (EMC) and electrostatic discharge (ESD) performance of an electrical unit. The apparatus comprises a cable tray positioned adjacent the unit, the cable tray having arranged upon it cabling which is representative of the normal cable installation for the unit and in which the cabling is connected to the unit. A cable tray base plate may also be provided. The cable tray is pivotally, and detachably, mounted to the base plate such that the orientation of the cable tray with respect to the base plate is adjustable.

7 Claims, 3 Drawing Sheets

1

ELECTRICAL TEST ARRANGEMENT AND APPARATUS

This is a continuation divisional application under 37 CFR 1.62, prior application Ser. No. 08/119,287, filed on Sep. 9, 1993, now abandoned.

BACKGROUND OF THE INVENTION

1. Field of the Invention

This invention relates to an electrical test arrangement and apparatus particularly for testing the electromagnetic compatibility (EMC) and electrostatic discharge (ESD) performance of equipment.

2. Description of the Related Art

When equipment has been constructed of an electrical or electronic nature it must be tested for its ability to withstand electromagnetic influences from an outside source, and also to check that it does not produce excessive levels of electromagnetic emissions. In order to do this, the equipment is normally fitted with representative cables and subjected to standard tests in an EMC test facility, such as an anechoic chamber or an open area test site.

To enable these tests to be performed, the equipment has to be placed in the test facility and then the cabling is assembled around it and connected as required. It is also a requirement of these tests that the precise positions of all the cables are recorded, so that tests can be repeated under the same conditions at a later date if necessary. This can be time consuming and since the test facility in which the tests take place are normally hired on a daily basis, the total process can be expensive, as the test facility has to be hired for the setting up and dismantling of the equipment, including cabling, as well as for the actual testing.

SUMMARY OF THE INVENTION

An object of the present invention is to reduce this set-up time and to provide an improved method of cabling the equipment and one which allows precise reproducibility.

According to one aspect of the present invention, the electrical test arrangement includes rack means for a unit or apparatus under test and a cable tray upon which cabling to be connected to the unit or apparatus under test is assembled.

According to another aspect of the present invention the present test apparatus includes a rack support and a cable tray upon which cabling to be connected to a unit or apparatus under test is assembled, the tray being provided with means on a base thereof, so that it can be repositioned from a first orientation to a second orientation for subsequent tests. The said means may be a hinge.

The hinged means which allows realignment of the tray on the apparatus is preferably of a removable nature, so that a first tray can be removed and replaced by a second tray. Furthermore, the hinged means normally allows the tray to be moved through 90 degrees, however, any intermediate position of the tray can be selected if necessary.

The apparatus can also be provided with means whereby cabling can be fed to a dummy unit, which is arranged to be positioned in the rack alongside the unit under test. The cable screen connections to this dummy unit may be to an earthed conductive plate whereby cable screen currents can be conducted to earth.

The complete test arrangement may be located on a trolley which allows movement of the whole arrangement within the test facility and immediate area.

It may be convenient that means such as a conductive plate is provided within the apparatus whereby EDS tests may be effected. Such a device may comprise a length of sheet metal bent at right angles along its length to form a single L-shaped plate, which is able to be temporarily positioned over the cable tray and in close proximity thereto, so that the cables may be exposed to the indirect effects of electrostatic discharges.

BRIEF DESCRIPTION OF THE DRAWINGS

In order that the invention may be readily understood, one example of a test arrangement and a modification thereof in accordance therewith will now be described with reference to the five figures of the accompanying drawings.

DETAILED DESCRIPTION OF THE PREFERRED EMBODIMENTS

Figure 1:
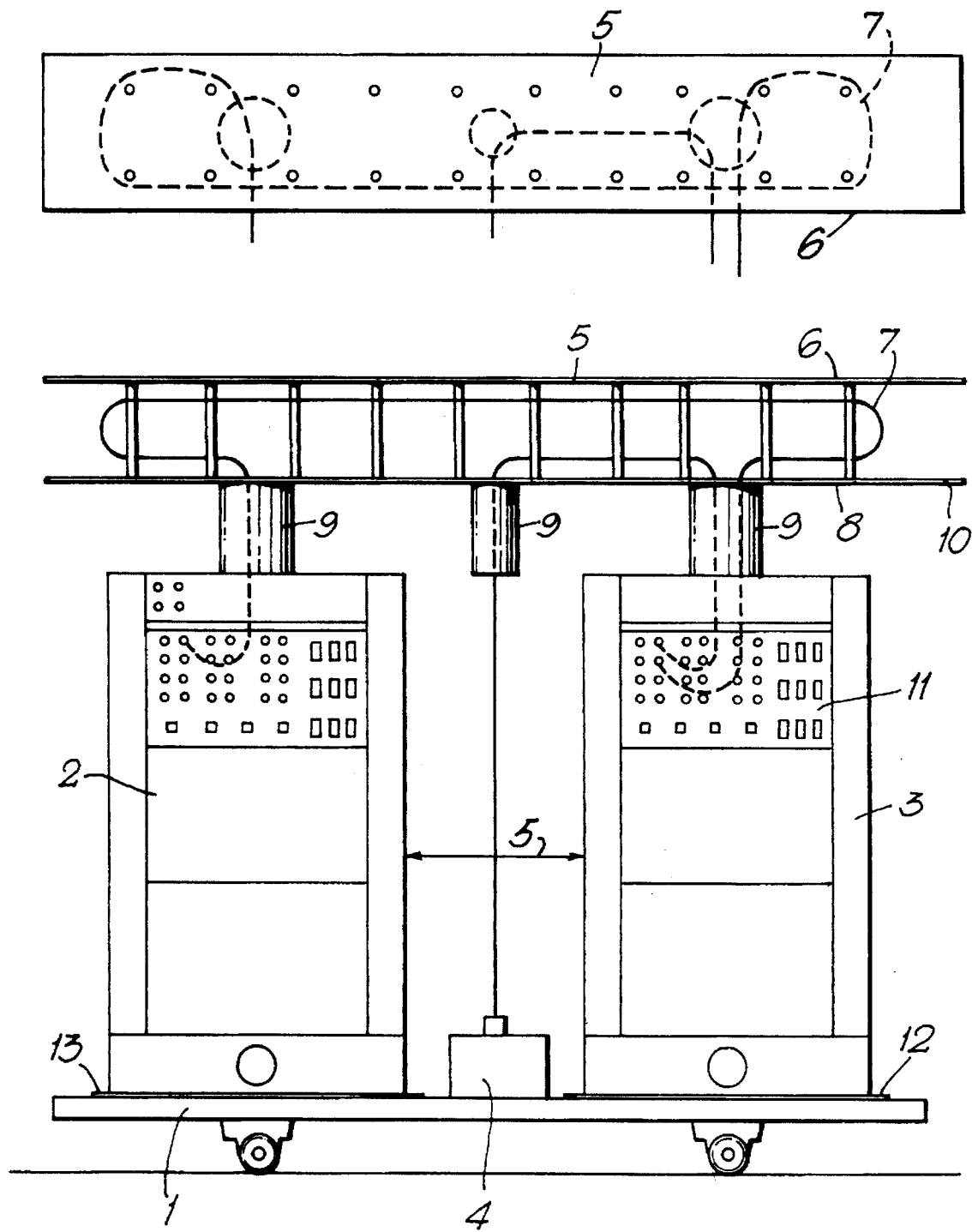
FIG. 1 shows a schematic view of a test arrangement which includes racks for the units or apparatus under test and a dummy unit mounted on those racks, FIG. 2 in 2A shows a perspective view of a modified apparatus of FIG. 1 and in FIG. 2B shows a side view of the apparatus of FIG. 2A.
Figure 2A:
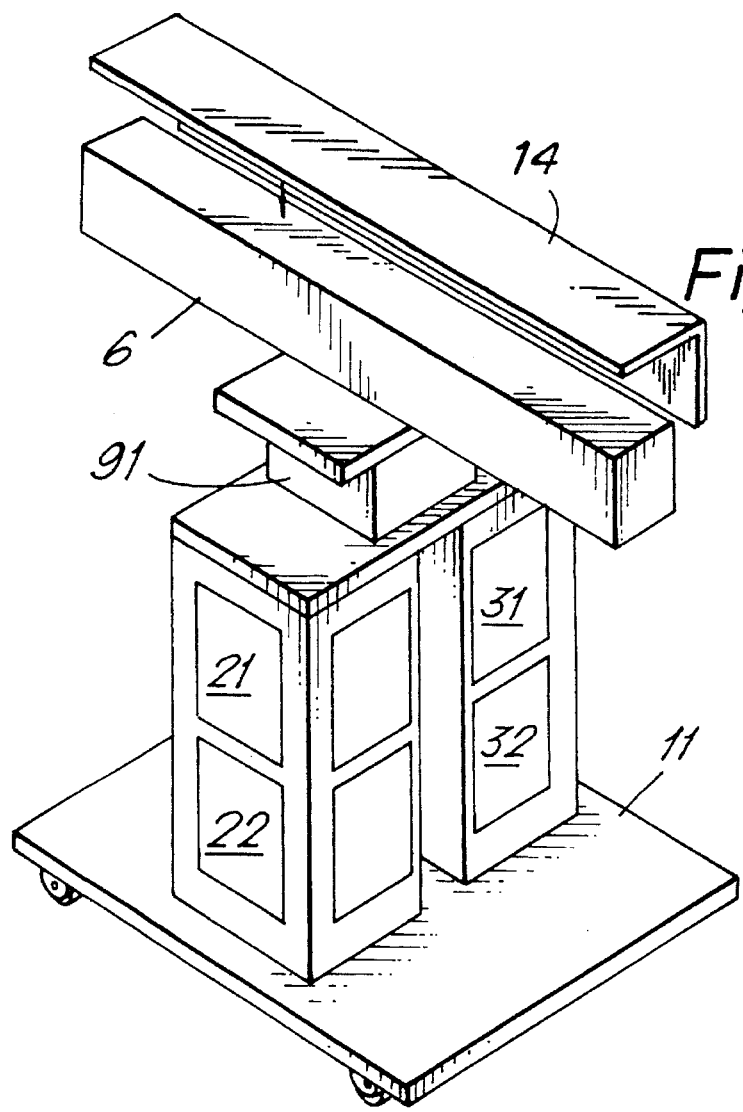
Figure 2B:
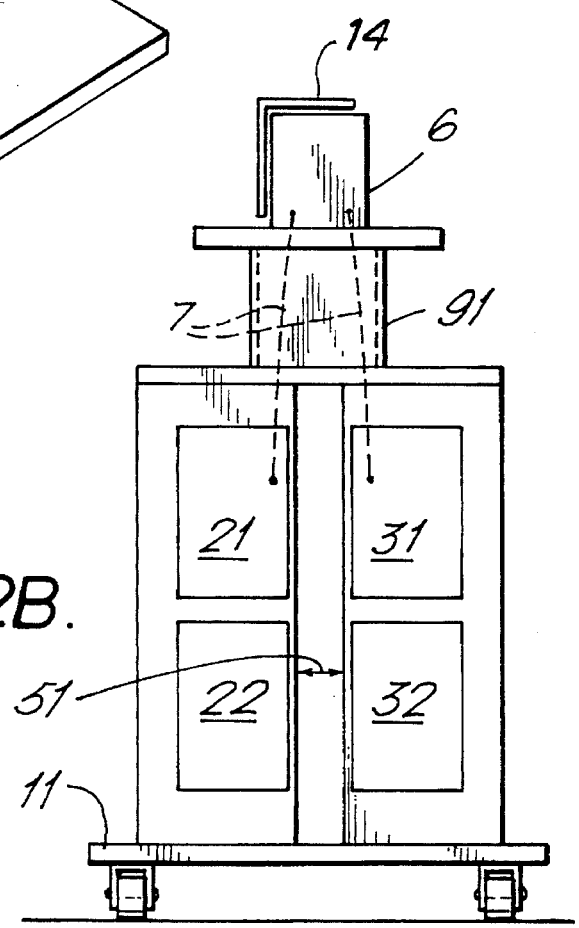

Referring now to FIG. 1 of the drawing, this shows a wooden trolley member (1) upon which is mounted a rack containing the unit under test (2) which is separated from a second rack containing a dummy unit (3) by a gap (5) of a specified distance. In this case the distance is 0.5 meters. The trolley also mounts an optional cable tray access unit (4) which may be insulated and to which cables from interfacing test equipment may be connected.

On top of the racks containing units (2) and (3), a wooden base plate (8) is mounted which carries a wooden cable tray (6), upon which the connecting cables (7) are assembled. The base plate (8) of the apparatus is provided with supporting conduits (9) which can be guides for the cables (7) assembled on the tray (6). The tray (6) can be hinged at its tilt axis (10) so that it may be moved from a horizontal orientation as shown in the lower part of the drawing, to a vertical orientation as shown in the top part of the drawing.

One purpose of the dummy unit (3) is to simulate an adjoining rack, or a distribution frame, which the unit under test may be associated with in a normal installation. The dummy unit (3) contains connection points for one end of the cables (7) on the tray (6) and these connection points can be used to provide a loop-back facility for signals produced at output ports on the unit (2) under test, which are then allowed to return to other ports on the unit under test. This method is economical and allows a correct stimulation of systems with multiple ports (e.g. multiplexers) by the connection in series of signals originating at one source.

The cable connection points on the dummy unit (3) are mounted on an earthed metal plate or backplane, which is intended to provide a low impedance route to earth for any screen currents on the cables, and thereby limits the effective cable length over which longitudinal screen currents can couple into the inner conductors via the cable surface transfer impedance, This route to earth is important during ESD tests, where transient, high peak currents can be carried by the screens of cables on the unit under test. ESD tests are required to be performed on the unit (2), but related effects produced by cable screen currents can dominate the observed results if these are not prevented or subdued.

In order to carry out indirect ESD testing, a length of sheet metal (14) bent at right angles along its length to form an L-shape with vertical and horizontal faces, can be temporarily positioned over the tray (6) in close proximity to the cables (7), for the purpose of exposing them to the indirect effects of ESD.

A major function of the apparatus is to position the connecting cables (7) in the correct relationship with respect to the unit under test (2), in a manner which is representative of the normal cable installation practice for the equipment under test, whilst also effectively exposing the cables to the electromagnetic environment of the test facility.

The cables (7) can be assembled on the tray (6) in a number of ways. In one particular case, the cables are wound onto the tray in the form of a single, partially closed loop, or "C" shape, as shown in the drawing, which creates the effect of a semi-folded dipole. The cables (7) from the tray (6) pass through the supporting conduits (9) to the unit under test (2) and the dummy unit (3). The tray (6) can be pivoted about its tilt axis (10) from a vertical to a horizontal mode of alignment. The vertical and horizontal modes allow the exposure angle or "face" of the folded dipole to be changed relative to the EMC environment i.e. radiation to, or from, a test antenna which is located in the EMC test facility.

One advantage of the invention is that the cable tray, with its cables in place, can easily be removed from the main structure without changing any other aspects of the configuration and the tray can then be replaced if necessary with trays containing different cable types, or different cable arrangements. These dedicated cable trays can be stored for re-use at a later date if tests have to be repeated.

The cable tray base plate (8) can be hinged in a manner that allows ready removal and the hinges can be of a type similar to rising butt hinges where one hinge part can be slid off the other. This has the great advantage that once the racks for mounting units (2) and (3) are in position on the trolley, then the cable tray and supporting assembly can be mounted on top of these racks and the cables passed through the conduits (9) and connected to the unit under test (2) and the dummy shelf (3) when required. The cables can be assembled onto the cable tray and the complete arrangement constructed outside the test facility and therefore no time is wasted within the facility in assembling the equipment and the cables. This was the case previously and could be costly.

The cable trays can be stored separately and if a test is to be repeated, it can easily be performed with the same cable arrangement as previously used, since the exact positions of all the cables has been retained by virtue of them being attached to the cable tray. This commends itself as being a system whereby precise reproducibility is achieved.

The use of a trolley (1) enables the test arrangement to be set-up outside the test facility and then wheeled in and out swiftly. Also where a turntable is not available in the test facility, the trolley allows the orientation of the whole arrangement, relative to a test antenna to be easily achieved.

The use of the invention also allows comparative tests to be made in a controlled manner on the unit under test (2), using different cable arrangements. Furthermore, consistently reproducible test conditions can be provided at different dates by being able repeatedly to use precisely the same cable arrangements. This is an important feature of EMC testing. For example, for tests on the continuing EMC compliance of equipment over its production lifetime, or retesting after modifications to the equipment. The invention also gives the advantage that different configurations of units under test can use the same basic test apparatus, each configuration equipped, if necessary, with its own dedicated cable tray.

Although in this example, the cable tray and other parts of the apparatus are referred to as being made of wood, they can of course be-made from any appropriate metal as required to simulate the normal installation conditions of the unit under test. The material is preferably of an electrically non-conducting material.

As shown in FIG. 1 the unit 1 under test and the dummy unit (3) are mounted side by side on the trolley (1). Since these units have usually very little depth if a large number of units 21,22 are present which increases the height to over 2 meters, there is a substantial risk of the unit being unstable. To overcome this the arrangement of units is on a wide trolley (11) with the dummy units 31,32 positioned behind the units (21), (22) under test.

A central conduit (91) supports the tray 6 and feeds into units (31, 32; 21,22). These units are again separated by a gap 51. In a typical example the gap is 0.33 meters.

Systems which require a large number of cables are expected to use trays which retain the cables as permanent, or semi-permanent fixtures. Removing the cables from such a tray would require the precise reconstruction of each cable position if further testing became necessary. This would be time consuming for a large number of cables and ideally the cables should be left in position on the tray to provide repeatability and to save unnecessary re-assembly costs. The cables have to be stored somewhere for possible future use and a cable tray gives better protection than an untidy bundle.

Figure 3:
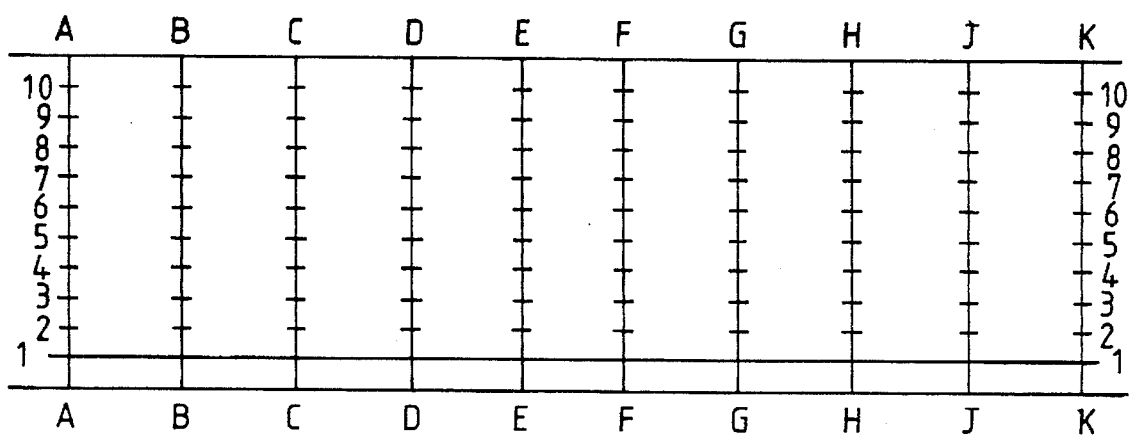
FIGS. 3 and 4 show details of a possible cable tray layout arrangement and FIG. 5 shows a detail of the tray arrangement.
Figure 4:
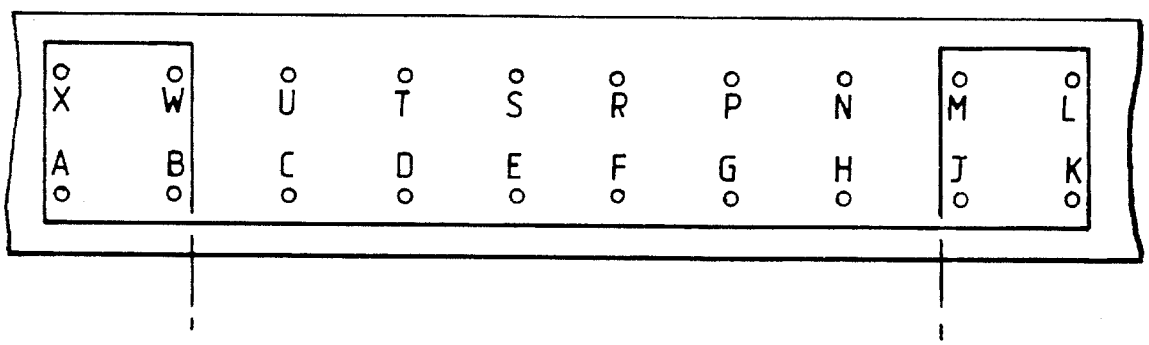
Figure 5:
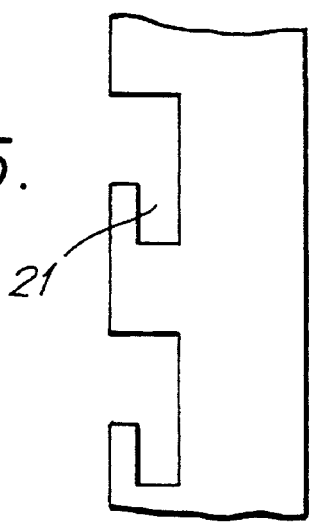

Referring now to FIGS. 3, 4 and 5. An alterative cabling method has been devised for systems requiring only a few cables which can easily be reconfigured or dismantled after testing. In this method the cables are placed into clips, slots, or grooves (21) positioned at marked intervals, or "stations" around the tray and at a series of different heights thereon, such that individually marked cables can be assembled on the tray and the positions of each cable recorded. The cables can then be removed from the tray at the end of EMC testing, but the recorded information would enable the cable positions to be readily re-established at a future date if necessary.

This method is illustrated in FIGS. 3 and 4, which show a number of "stations" positioned around the tray, each marked by a letter or the alphabet. At each of these stations a number of clips or grooves (21) (FIG. 5) are placed in a vertical sequence over the height of the tray, marked from 1 to 10. Representative cables (7) for connection to an EUT are each placed into one of these marked points at each station around the tray in an orderly fashion, and the positions occupied by each cable are recorded. For example, cable number 1 may occupy position 1 at each station around the tray in a circular, or semicircular loop, and this is recorded in the EMC test documentation for that equipment, together with other details of the cable, such as its type, length, terminating connectors and the connection points on the EUT and the dummy unit. The cables themselves are marked or coded in a manner which allows ready identification, and they are then stored for re-use. This method allows a single cable tray and a limited number of cables to be used for many different equipment types.

I claim:

1. Apparatus for use in testing the electromagnetic compatibility (EMC) of an electrical unit which is connected, during normal operation, to electrical equipment by equipment cabling arranged in a predetermined cabling configuration, said apparatus comprising: a cable tray for positioning, during testing, adjacent said electrical unit, said cable tray having test cabling arranged in said predetermined cabling configuration thereupon, said test cabling being connected to said electrical unit during testing to reproduce the electromagnetic characteristics of the equipment cabling.

2. Apparatus according to claim 1, further including a cable tray base plate, and means for pivotally, and detachably, mounting said cable tray to said base plate such that the orientation of said cable tray with respect to said base plate is adjustable.

3. Apparatus according to claim 2, in which said means comprise a hinge in which respective halves of said hinge are detachable such that said cable tray can be removed and replaced by a second cable tray.

4. Apparatus according to claim 2, in which said means allows orientation of the cable tray to be adjusted through 90° and fixed at any angle therebetween.

5. Apparatus according to claim 1, further including a dummy unit positioned alongside said electrical unit, and means for connecting the test cabling to said dummy.

6. Apparatus according to claim 1, further including a conductive plate for effecting electrostatic discharge (ESD) tests, said plate being of generally L-shaped cross-section and being positioned over said cable tray and in close proximity thereto to expose the test cabling to the indirect effects of electrostatic discharges.

7. Apparatus according to claim 1, further including an earthed conductive plate within said apparatus to conduct cable screen currents to earth.

* * * * *